United States Patent [19]

Krenik et al.

[11] Patent Number: 5,148,065
[45] Date of Patent: Sep. 15, 1992

[54] CURRENT STEERING CIRCUITS AND METHODS WITH REDUCED CAPACITIVE EFFECTS

[75] Inventors: William R. Krenik, Garland; Louis J. Izzi, Plano, both of Tex.

[73] Assignee: Texas Instruments Incorporated, Dallas, Tex.

[21] Appl. No.: 723,089

[22] Filed: Jun. 28, 1991

[51] Int. Cl.$^5$ ............................................. H03K 3/01
[52] U.S. Cl. ..................................... 307/572; 307/542; 307/585; 307/263; 307/270; 364/490; 364/491
[58] Field of Search ............... 307/572, 542, 585, 263, 307/270; 364/490, 491

[56] References Cited

U.S. PATENT DOCUMENTS

| | | | |
|---|---|---|---|
| 4,680,480 | 7/1987 | Hopta | 307/270 |
| 4,847,519 | 7/1989 | Wahl et al. | 307/270 |
| 4,945,259 | 7/1990 | Anderson | 307/270 |

Primary Examiner—Stanley D. Miller
Assistant Examiner—Scott A. Ouellette
Attorney, Agent, or Firm—Robby T. Holland; Rene' E. Grossman; Richard L. Donaldson

[57] ABSTRACT

Capacitance compensation techniques are used to reduce capacitive effects that impact on the performance of current steering circuits (FIG. 1). In an isolation technique (FIGS. 2a-2e), a resistor (R) or a diode (D) is coupled to a data-switched transistor to dampen voltage perturbations associated with the gate-to-source capacitance. In a design variable technique FIGS. 3a-3d), a transistor (PDV) is included in either the output or ground legs of the current steering circuit to provide a design variable to counteract the capacitive effects of the associated data-switched (PDX/NDX) or voltage-controlled (PREF) transistor. In a bipolar substitution technique (FIG. 4), a data-switched bipolar transistor (QDX) is substituted for the data-switched MOS transistor, and made sufficiently small to significantly reduce junction capacitance. In addition, capacitive effects can be reduced by introducing fabrication alterations (FIGS. 5a-5b), such as fabrication layouts in which the source contact is made within a U-shaped gate (FIG. 5a), and in which moat perimeter is contoured (FIG. 5b) for minimal gate area consistent with standard gate/contact spacing requirements.

35 Claims, 3 Drawing Sheets

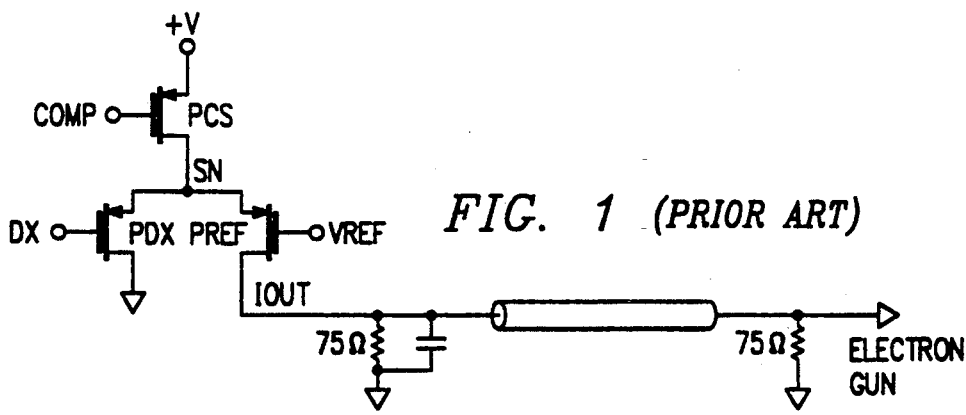
FIG. 1 (PRIOR ART)
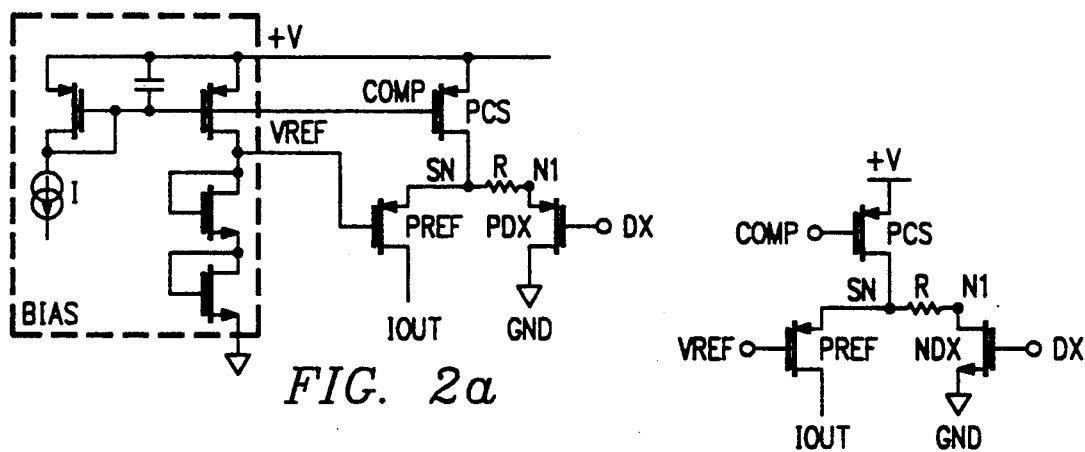
FIG. 2a
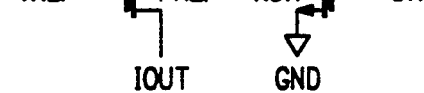
FIG. 2b
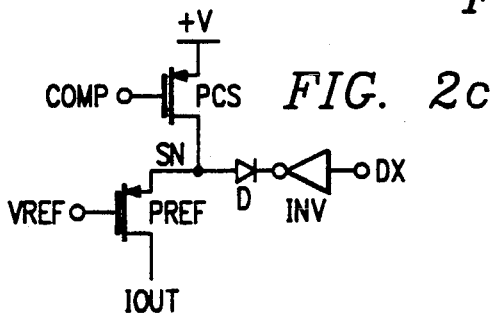
FIG. 2c
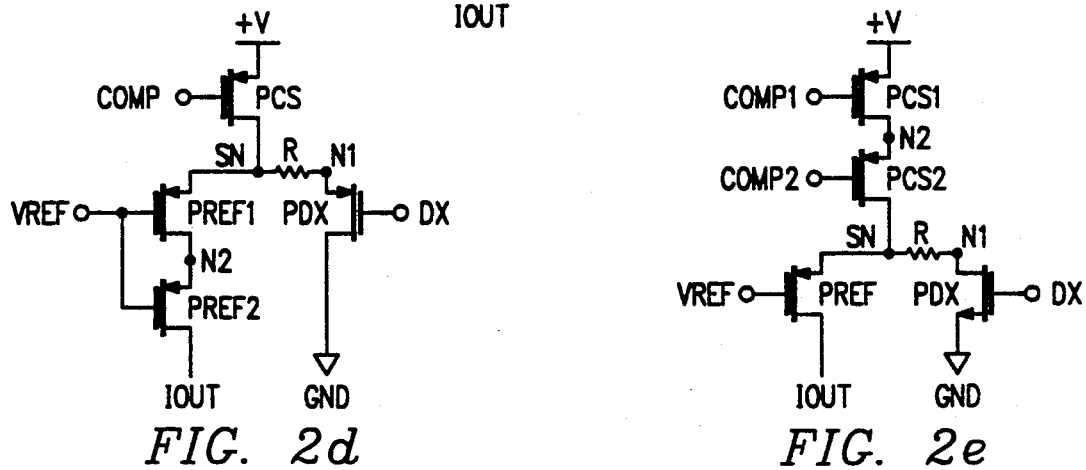
FIG. 2d
FIG. 2e

CURRENT STEERING CIRCUITS AND METHODS WITH REDUCED CAPACITIVE EFFECTS

TECHNICAL FIELD OF THE INVENTION

The invention relates generally to integrated circuits, and more particularly relates to circuit techniques for reducing capacitive effects in a current steering circuit. In even greater particularity, integrated circuit current steering cells (such as for implementing video D-to-A converters) use capacitance-reducing fabrication alterations, and further reduce capacitive effects by including either: (a) an inactive compensation device (such as a resistor) coupled to a data-switched transistor to dampen voltage perturbations; (b) an active compensation device (such as a transistor) coupled into either circuit leg to provide an additional design variable for counteracting voltage perturbations; or (c) in an MOS current steering circuit, replacing the data-switched MOS transistor with a relatively small bipolar transistor to reduce the capacitive effects.

BACKGROUND OF THE INVENTION

Current steering circuits are able to rapidly switch, or steer, the current output of a constant current source between an output leg and a ground leg, thereby switching the output current. A common application for such circuits is video DACs (D-to-A converters) that control the electron guns for video display tubes.

Without limiting the scope of the invention, this background information is provided in the context of a specific problem to which the invention can be applied: improving the performance of current steering circuits in terms of speed and/or accuracy.

FIG. 1 illustrates a portion of a conventional video DAC application using current steering. The DAC, including current steering circuitry, provides switched output current through a COAX connection to a video display tube for controlling an electron gun. The current steering circuitry is shown implemented in PMOS, although NMOS, CMOS and bipolar implementations have been used.

A current source PCS controlled by a compensated bias attempts to feed a constant current into a summing node SN. The current is steered into either an output leg or a ground leg by data switching logic DX coupled to the control gate of a transistor PDX in the ground leg, while a control or control voltage VREF is applied to the control gate of a transistor PREF in the output leg.

As PDX is switched by the DX signal (for example, at 150 MHz), causing PREF to switch at the same rate, the gate-to-source capacitance $C_{GS}$ of PDX results in AC coupling to the summing node SN. These capacitive effects cause voltage perturbations at SN, which in turn affects the gate-to-source voltage $V_{GS}$ of the current source PCS. For example, as DX switches HI, the capacitive effect of $C_{GS}$ tends to drive the summing node HI—because of the gate-to-drain capacitance $C_{GD}$ of PCS, this voltage perturbation at SN reduces the $V_{GS}$ of PCS, hence reducing current flow through PCS.

The increased noise at SN makes it difficult to maintain a constant current through PCS, even with a compensated bias, a condition which adversely affects performance. As a result, design trade-offs must be made regarding speed, accuracy, and glitch energy. Thus, to achieve greater switching speeds, on the order of 500 MHz, accuracy is generally limited to 4 bits, while providing 8 bit accuracy requires slower switching speeds, on the order of 150 MHz.

Accordingly, a need exists for a compensation scheme to counteract perturbations at the summing node of a current steering circuit, thereby allowing increased performance in terms of speed and accuracy.

SUMMARY OF THE INVENTION

The invention is a reduced-capacitance current steering circuit configured to reduce capacitive effects at the summing node, thereby enhancing current steering performance. In exemplary integrated circuit current steering cells used for video DACs, capacitive compensation is accomplished by introducing fabrication alterations that reduce junction capacitances, and by introducing either: (a) an inactive compensation device (such as a resistor) between the data-switched transistor and the summing node to dampen perturbations; or (b) an active compensation device (such as a transistor) into either circuit leg to provide an additional design variable for counteracting capacitive effects. Alternatively, in an MOS current steering circuit, the data switched MOS transistor can be replaced with a bipolar transistor that is made sufficiently small to reduce capacitive effects.

In one aspect of the invention, the current steering circuit includes a current source biased to feed a substantially constant current into a summing node, where the current is steered into either an output leg or a ground leg in response to a data switching signal applied to a data-switched device in one of the legs. A voltage-controlled device in the other leg is controlled by a control voltage such that it switches cooperatively with the data-switched device. A compensation device is coupled into either the output leg or the ground leg so as to reduce data-switching-induced capacitive effects, and associated voltage perturbations at the summing node.

In more specific aspects of the invention, the compensation device may be either an inactive compensation device (such as a resistor) coupled between the data-switched device and the summing node to dampen voltage perturbations, or an active compensation device (such as a transistor) coupled into either leg of the current steering circuit to provide an additional design variable. Alternatively, for MOS implementations, a bipolar transistor can be used as both the compensation device and the data-switched device, with the bipolar transistor being sufficiently small to reduce the effect of junction capacitance at the summing node.

In exemplary embodiments of the reduced-capacitance current steering circuit, the basic current steering circuit is configured from PMOS transistors, with a data-switched transistor being located in the ground leg. The invention involves four basic capacitance compensation techniques that reduce the capacitive effects that introduce noise at the summing node: providing isolation, introducing a design variable, substituting a bipolar transistor, and introducing fabrication alterations.

For the isolation technique, a resistor or a diode is coupled between the data-switching transistor and the summing node, thereby dampening voltage perturbations associated with the gate-to-source capacitance of the data-switched transistor. For the design variable technique, a PMOS transistor is included in either the output or ground legs of the current steering circuit, thereby providing a design variable to counteract the capacitive effects of the associated data-switched or voltage-controlled transistor. For the bipolar substitution technique, a data-switched bipolar transistor is substituted for the data-switched MOS transistor, and made sufficiently small to significantly reduce junction capacitance.

Finally, capacitive effects can be reduced by introducing fabrication alterations—such as fabrication layouts and altering certain transistor parameters such as turn-on voltage—without significantly adding to fabrication process complexity. For example, for MOS applications, at least the output- and ground-leg transistors can be fabricated with minimal moat area (consistent with minimal layout requirements) to reduce junction capacitances. In addition, at least the data-switched transistor can be fabricated with a U-shaped gate, with the contact to its source being made in the channel between the legs of the gate, also reducing junction capacitance.

The technical advantages of the invention include the following. The capacitance compensation techniques reduce capacitance effects, thereby counteracting voltage perturbations that would otherwise affect the constant current source, and permitting performance enhancement in terms of speed and accuracy. Design flexibility is provided in selecting a specific approach, or combination of capacitance compensation techniques: isolation, design variable, or bipolar substitution, and fabrication alterations.

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which:

FIG. 1 illustrates a conventional current steering circuit implemented in PMOS;

FIGS. 2a-2e illustrate exemplary alternative reduced-capacitance current steering circuits that use an inactive capacitance compensation device—a resistor or a diode;

DETAILED DESCRIPTION OF THE INVENTION

Figure 3A:
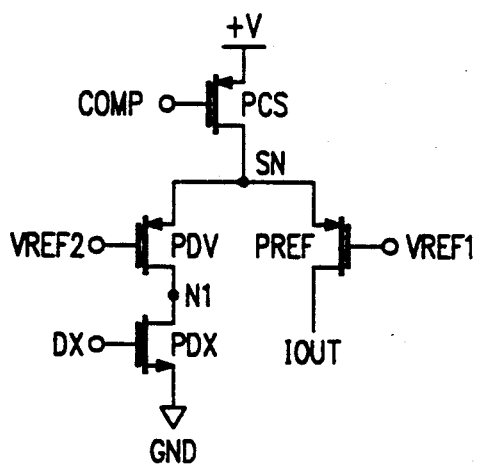
FIGS. 3a-3d illustrate exemplary alternative reduced-capacitance current steering circuits that use an active capacitance compensation device—a transistor.

The Detailed Description of an exemplary embodiments of a reduced-capacitance current steering circuit is organized as follows:
1. Reducing Capacitive Effects
  1.1. Isolation Technique
  1.2. Design Variable Technique
  1.3. Bipolar Substitution Technique
2. Fabrication Alteration
3. Conclusion The several techniques to reducing capacitive effects that cause voltage perturbations at the summing node of a current steering circuit—isolation, design variable, bipolar substitution, and fabrication alteration—are described in connection with a number of exemplary circuit implementations that can be used in a video DAC.

1. Reducing Capacitive Effects

As described in the Background, FIG. 1 illustrates the conventional configuration for a current steering circuit.

In this PMOS implementation, the p-channel current source transistor PCS attempts to feed a constant current into the summing node SN, which is then steered into either the output leg or the ground leg in a data switching operation. The junction capacitances $C_{GS}$ associated with the data-switched transistor PDX and the voltage-controlled transistor PREF result in AC coupling to the summing node SN, causing voltage perturbations that affect the $V_{GS}$ for the current source PCS.

The invention involves three circuit design approaches to the basic technique of using a capacitance-compensation device in one leg of the current steering circuit to reduce the capacitive effects that introduce noise at the summing node: isolation, design variable, and bipolar substitution. In addition, certain fabrication alteration techniques (described in Section 2) can be combined with any of the circuit design techniques to achieve further reductions in capacitive effects.

The circuit design techniques to reducing capacitive effects are described in connection with exemplary circuit implementations. Each exemplary circuit implementation illustrates a particular circuit design technique, although these techniques may be used in combination.

In addition, in each circuit implementation, the non-data-switched leg of the current steering circuit includes a voltage-controlled transistor PREF that is controlled by a voltage VREF. While VREF will typically be a constant bias voltage, it need not be—the control voltage VREF may be a time-varying voltage level adapted to cooperatively control the switching of the non-data-switched transistor.

1.1. Isolation Technique

FIGS. 2a-2e illustrate exemplary circuit implementations of the isolation technique to providing a reduced-capacitance current steering circuit. For the isolation technique, an inactive compensation device such as a resistor or a diode is coupled between the data-switching transistor PDX and the summing node, thereby dampening voltage perturbations associated with the gate-to-source capacitance of the data-switched transistor.

Referring to FIG. 2a, a basic current steering circuit includes PMOS current steering circuitry and a CMOS compensated bias network. The current steering circuitry includes a current source transistor PCS that attempts to feed a constant current through a summing node SN either (a) to the output leg IOUT, through a voltage-controlled transistor PREF, or (b) to the ground leg GND, through a data-switched transistor PDX.

A conventional compensated bias network provides a compensated bias COMP to PCS, and a control voltage VREF to PREF. The bias network is exemplary only—the generation of the control voltages for the current source transistor and the non-data-switched transistor are not part of the invention, and many alternative configurations are known in the art.

Compensation for capacitive effects at the summing node SN is achieved by coupling a compensation resistor R between the data-switched transistor PDX and the summing node. The compensation resistor dampens the voltage perturbations created by the junction capacitance of PDX and appearing at the node N1, thereby reducing noise that affects the current source PCS. The size of the compensation resistor depends principally on the gate-to-source capacitance of PDX and the desired circuit speed, with an exemplary range being 10–100 ohms.

Referring to FIG. 2b, the current steering implementation in FIG. 2a is modified by replacing the PMOS data-switching transistor with an NMOS transistor NDX, taking advantage of the speed advantages associated with NMOS. In a conventional current steering circuit, using NMOS for the data-switched transistor is problematic because when the transistor turns on, the summing node will be pulled all the way to ground, causing long turn-on times. By introducing the compensation resistor R between the summing node and the data-switched transistor, the resulting voltage drop prevents the node N1 from going to ground, thereby reducing turn-on time.

In addition to providing switching speed advantages, an NMOS data-switched transistor NDX can be configured to reduce junction capacitance, thereby reducing capacitive effects at the summing node. Specifically, because NMOS is inherently more efficient than PMOS, the size of an NMOS transistor can be reduced relative to the size of a comparable PMOS transistor, thereby correspondingly reducing junction capacitance.

Referring to FIG. 2c, the current steering implementation in FIG. 2a is modified by using a compensation diode D as the inactive compensation device in place of the compensation resistor. In addition, this exemplary circuit implementation also illustrates replacing a data-switched transistor with a data-switched P/NMOS invertor which is controlled by the data switching signal DX. Like the compensation resistor, the compensation diode reduces AC coupling, thereby dampening voltage perturbations at the summing node SN.

A compensation diode could be substituted for the compensation resistor in either of the exemplary implementations in FIGS. 2a or 2b. The use of a resistor or a diode for the compensation device is a design choice that depends on such factors as gate-to-source capacitance and speed. Other types of inactive compensation devices include diode connected transistors.

Referring to FIGS. 2d and 2e, the current steering implementation in FIG. 2a is modified by using conventional cascoding techniques to improve accuracy. In FIG. 2d, the voltage-controlled transistor PREF of FIG. 2a is replaced with a cascode pair of voltage-controlled transistors PREF1 and PREF2. In FIG. 2e, the current source transistor of FIG. 2a is replaced with a cascode pair of current source transistors, each of which may be controlled by a different compensated bias signal.

1.2. Design Variable Technique

FIGS. 3a–3d illustrate exemplary circuit implementations of the design variable addition technique to providing a reduced-capacitance current steering circuit. For the design variable technique, a PMOS transistor is included in either the output or ground legs of the current steering circuit, thereby providing a design variable to counteract the capacitive effects of the associated data-switched or voltage-controlled transistor.

Referring to FIG. 3a, in place of the inactive compensation device (resistor or diode) in the implementations in FIGS. 2a–2e, a design-variable PMOS transistor PDV is coupled between the data-switched transistor PDX, at node N1, and the summing node SN. The design-variable transistor PDV is controlled by a control voltage VREF2 (which may be different than the control voltage for the voltage-controlled transistor PREF).

The design-variable transistor PDV provides an active compensation device by which the potential between the nodes N1/SN can be precisely controlled by the appropriate selection of the control voltage VREF2 and the size of the transistor. In operation, PDV counteracts the AC coupling effects of the gate-to-drain capacitance of PDX CGD.

Figure 3B:
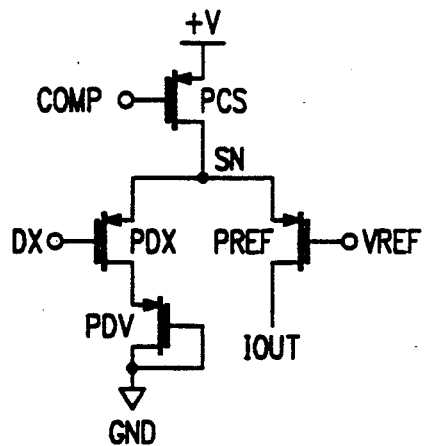

Referring to FIG. 3b, the design-variable PMOS transistor PDV is here coupled between the data-switched transistor PDX and ground, with its gate being coupled to its drain. In operation, when PDX switches, $V_{GS}$ for PDV changes, which leads to a change in the $V_{DS}$ for PDX, which causes a desired change in the $V_{GS}$ for PDX.

Capacitive effects at the summing node SN are controllable by the selection of PDX and PDV device sizing. Additional reduction in capacitive effects can be obtained by introducing a compensation resistor between the data-switched transistor PDX and the summing node.

Figure 3C:
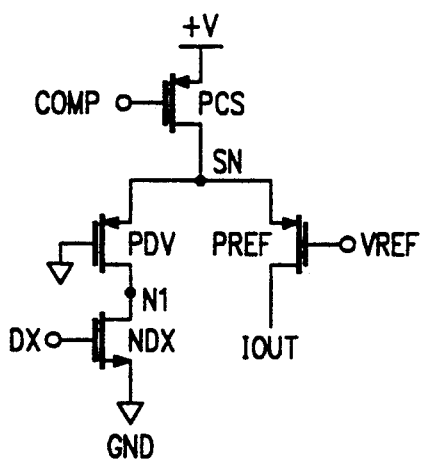

Referring to FIG. 3c, the current steering implementation in FIG. 3a is modified by making the voltage reference for the design variable transistor PDV ground, and using an NMOS data-switched transistor NDX. As with the circuit implementation in FIG. 2b, the introduction of the design variable transistor PDV between the data-switched transistor PDX and the summing node adds a voltage drop that prevents the node N1 from going to ground when NDX switches LO. This allows the use of an NMOS data-switched transistor, with the attendant advantages of speed enhancement and junction capacitance reduction described in connection with the circuit implementation in FIG. 2b.

Figure 3D:
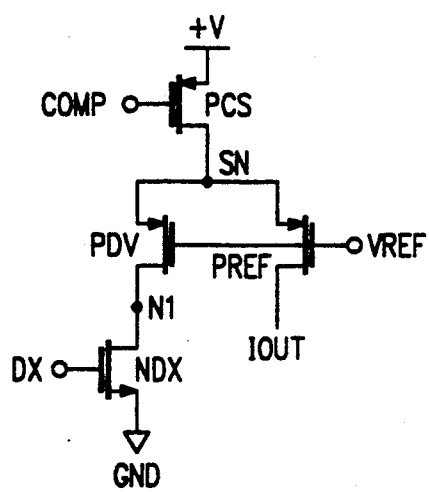

Referring to FIG. 3d, the circuit implementation in FIG. 3a is modified by using the same control voltage for the voltage-controlled transistor PREF and the design-variable transistor PDV. As a result, biasing is simplified.

An additional design variable technique is to adjust the back-gate voltage (the voltage of the well relative to the source) for either the data-switched or the voltage controlled transistor so as to reduce capacitive effects. That is, the voltage of the well in which the selected transistor is fabricated would be controlled relative to the transistor source so as to provide a design variable for reducing capacitive effects. While this technique does not require introducing an active compensation device into the current steering circuit, it preferably would be implemented in conjunction with a compensation device, either active or inactive.

1.3. Bipolar Substitution Technique

Figure 4:
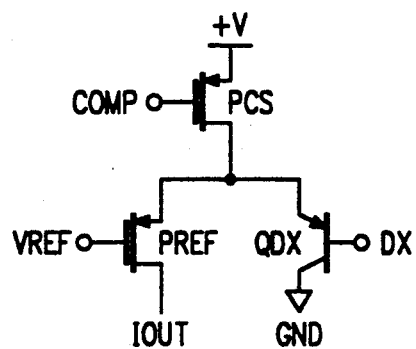
FIG. 4 illustrates a reduced-capacitance current steering circuit in which an MOS data-switched transistor is replaced with a relatively smaller bipolar transistor with reduced junction capacitance.

FIG. 4 illustrates an exemplary circuit implementations of the bipolar substitution technique for providing a reduced-capacitance current steering circuit. For the bipolar substitute technique, a data-switched bipolar transistor is substituted for the data-switched MOS transistor, and made sufficiently small to significantly reduce junction capacitance.

The basic current steering circuit in FIG. 1 is modified by replacing the PMOS data-switched transistor with a bipolar PNP QDX, the base of which is controlled by the data switching signal DX. The current source transistor PCS and the voltage-controlled transistor PREF remain PMOS transistors.

In effect, the bipolar data-switched transistor QDX replaces both the compensation device and the data-switched PMOS transistor. A reduction in capacitive effects at the summing node SN is achieved by the appropriated selection of the size of QDX.

2. Fabrication Alterations

In addition to specific circuit implementations, capacitive effects can also be reduced through alterations in the standard fabrication processes for such circuit implementations—such as alterations in fabrication layout and processing. These fabrication alterations can be implemented without significantly adding to fabrication process complexity.

Figure 5A:
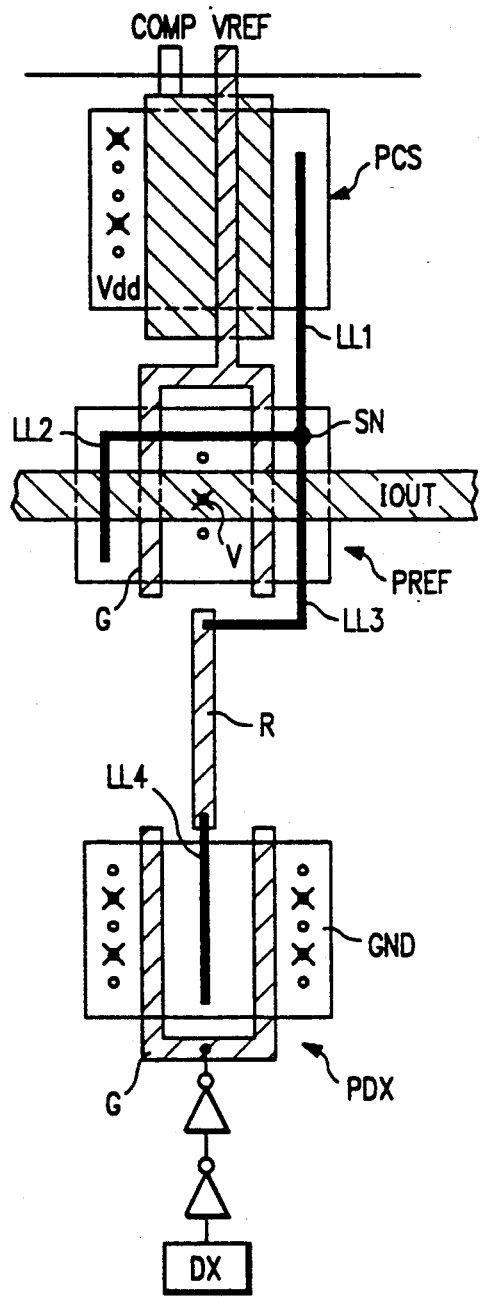
FIGS. 5a-5b illustrate fabrication layout techniques that respectively reduce moat area and configure the source contact to reduce junction capacitance.
Figure 5B:
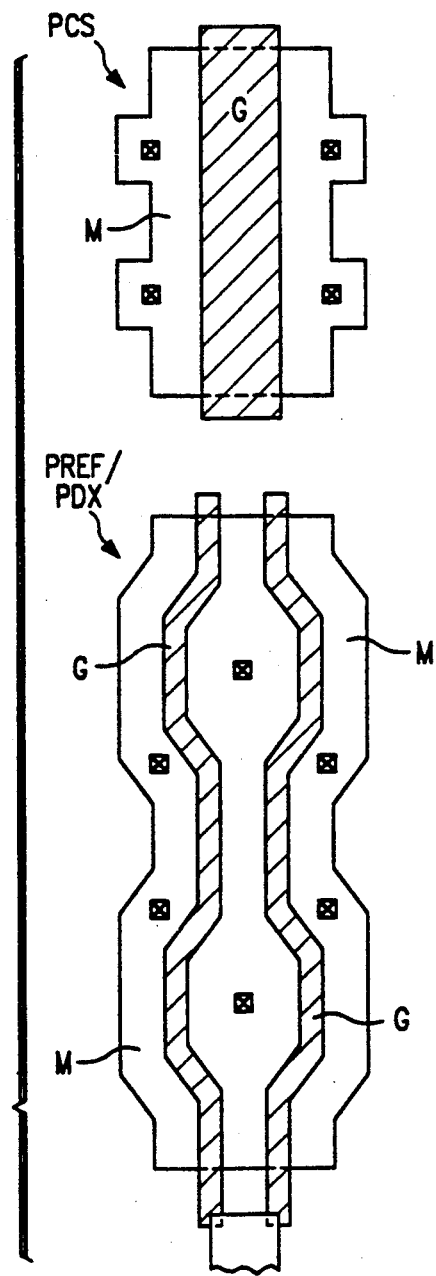

FIGS. 5a and 5b illustrate exemplary alterations in MOS fabrication layouts that can be used to provide a reduced-capacitance current steering circuit. The exemplary fabrication layout techniques for reducing junction capacitances of the transistors PREF and PDX involve moat configuration and lead line contact placement.

Referring to FIG. 5a, a functional fabrication layout is shown for the reduced-capacitance current steering circuit with a capacitance-compensation resistor, such as illustrated in FIG. 2a. It includes a current source transistor PCS, voltage-controlled transistor PREF, and data-switched transistor PDX, as well as the capacitance-compensation resistor R. The layout is illustrative only.

A lead line LL1 connects the drain of PCS to a summing node SN. The summing node is connected to the source of PREF by a lead line LL2, and to the compensation resistor R by a lead line LL3. The other end of the compensation resistor is connected to the source of PDX. An output line IOUT is connected to the drain of PREF using a via V.

Both PREF and PDX are fabricated with U-shaped gates G. Junction capacitance is significantly reduced when the source contact is made inside a U-shaped gate.

For the PREF transistor, the IOUT line makes contact with the PREF drain inside the U-shaped gate, while the lead line LL2 makes contact with the PREF source on the outside its U-shaped gate. For the PDX transistor, the lead line LL4 makes contact with the PDX source inside the U-shaped gate, while the ground contact to the drain is outside the U-shaped gate.

Because capacitive effects at the summing node are primarily attributable to the junction capacitance of PDX, that junction capacitance can be reduced by making the PDX source contact within the U-shaped gate. In contrast, for PREF, it is the drain contact to the IOUT line that is made inside the U-shaped gate because capacitance on the output node is also important.

Referring to FIG. 5b, more detailed fabrication layouts are provided for the current source transistor PCS and the voltage-controlled and data-switched transistors PREF/PDX with U-shaped gates. Additional reductions in junction capacitance can be achieved by appropriately tailoring the source/drain moats M to reduce the total area of the moats, consistent with maintaining appropriate spacing for contact areas and gates (i.e., standard minimal contact requirements).

Thus, for PCS, the moat perimeter is contoured to maintain only the minimal spacing for the contacts and the gate. The contouring of the moat perimeter is even more pronounced in the case of the PDX/PREF transistors, which also use serpentined gate lines to enable the moat perimeter to be contoured for minimal junction capacitance.

Regarding alterations in fabrication processing, fabrication processes can be adjusted to provide compensation for capacitive effects by controlling transistor gains, such as by controlling transistor turn-on voltages through the use of VT (voltage threshold) implants.

3. Conclusion

Although the Detailed Description of the invention has been directed to certain exemplary embodiments, various modifications of these exemplary embodiments, as well as alternative embodiments, will be suggested to those skilled in the art. For example, the invention has general applicability for improving the performance (speed and/or accuracy) of a current steering circuit using the compensation techniques of the invention. More specifically, while all of the exemplary current steering circuits show data-switched transistor PDX included in the ground leg, that transistor could be included in the output leg instead. And, while the various circuit implementations of the isolation and design variable techniques to reducing capacitive effects are illustrated for MOS, bipolar implementations could also be used.

It is to be understood that the invention encompass any modifications or alternative embodiments that fall within the scope of the appended claims.

What is claimed is:

1. A reduced-capacitance current steering circuit configured to reduce data-switching-induced capacitive effects, comprising:

a current steering circuit including a current source biased to feed a substantially constant current into a summing node, where the current is steered either to an output leg or to a ground leg;

a data-switched device coupled into one of the circuit legs for controlling the current steering operation in response to a data switching signal;

a voltage-controlled device, coupled into the other circuit leg, for receiving a control voltage signal such that it switches cooperatively with said data-switched device;

a compensation device coupled into either said output leg or said ground leg so as to reduce data-switching-induced capacitive effects, and associated voltage perturbations, at said summing node.

2. The current steering circuit of claim 1, wherein said compensation device is an inactive compensation device coupled between said data-switched device and the summing node to dampen voltage perturbations.

3. The current steering circuit of claim 2, wherein said inactive compensation device is a resistor.

4. The current steering circuit of claim 2, wherein said inactive compensation device is a diode.

5. The current steering circuit of claim 1, wherein said compensation device is an active compensation device that is controlled to counteract capacitive effects, thereby providing a design variable.

6. The current steering circuit of claim 4, wherein said active compensation device is an appropriately biased transistor.

7. The current steering circuit of claim 1, wherein said voltage-controlled device is an MOS transistor, and wherein said data-switched device and said compensation device comprise a bipolar transistor that is made sufficiently small relative to a comparable MOS transistor that the capacitive effect at said summing node is significantly reduced relative to the capacitive effect that would result from the use of a data-switched MOS transistor.

8. The current steering circuit of claim 1, wherein said data switching device is coupled into the ground leg.

9. The current steering circuit of claim 1, wherein said data switching device and said voltage-controlled device are transistors.

10. The current steering circuit of claim 9, wherein said data-switched and voltage-controlled transistors are PMOS.

11. The current steering circuit of claim 9, wherein said voltage-controlled transistor is PMOS and said data-switched transistor is NMOS.

12. The current steering circuit of claim 9, wherein the control voltage signal for said voltage-controlled transistor is a relatively constant bias voltage.

13. The current steering circuit of claim 9, wherein the control voltage signal for said voltage-controlled transistor is a time-varying voltage level adapted to cooperatively control the switching of said voltage-controlled transistor.

14. A reduced-capacitance current steering circuit configured to reduce data-switching-induced capacitive effects, comprising:
   a current steering circuit including a current source biased to feed a substantially constant current into a summing node, where the current is steered either to an output leg or to a ground leg;
   a data-switched device coupled into one of the circuit legs for controlling the current steering operation in response to a data switching signal;
   a voltage-controlled device, coupled into the other circuit leg, for receiving a control voltage signal such that it switches cooperatively with said data-switched device;
   an inactive compensation device coupled between said data-switched device and said summing node so as to reduce data-switching-induced capacitive effects, and associated voltage perturbations, at said summing node.

15. The current steering circuit of claim 14, wherein said inactive compensation device is a resistor.

16. The current steering circuit of claim 14, wherein said inactive compensation device is a diode.

17. The current steering circuit of claim 14, wherein said data switching device is coupled into the ground leg.

18. The current steering circuit of claim 14, wherein said data switching device and said voltage-controlled device are PMOS transistors.

19. The current steering circuit of claim 14, wherein said voltage-controlled device is a PMOS transistor and said data-switched device is an NMOS transistor.

20. The current steering circuit of claim 18, wherein the control voltage signal for said voltage-controlled transistor is a relatively constant bias voltage.

21. The current steering circuit of claim 14, further including an active compensation device coupled into either said output leg or said ground leg and controlled to counteract data-switching-induced capacitive effects, and associated voltage perturbations, at said summing node, thereby providing a design variable.

22. A reduced-capacitance current steering circuit configured to reduce data-switching-induced capacitive effects, comprising:
   a current steering circuit including a current source biased to feed a substantially constant current into a summing node, where the current is steered either to an output leg or to a ground leg;
   a data-switched device coupled into one of the circuit legs for controlling the current steering operation in response to a data switching signal;
   a voltage-controlled device, coupled into the other circuit leg, for receiving a control voltage signal such that it switches cooperatively with said data-switched device;
   an active compensation device coupled into either said output leg or said ground leg and controlled to counteract data-switching-induced capacitive effects, and associated voltage perturbations, at said summing node, thereby providing a design variable.

23. The current steering circuit of claim 22, wherein said active compensation device is an appropriately biased transistor.

24. The current steering circuit of claim 22, wherein said data switching device and said voltage-controlled device are transistors.

25. The current steering circuit of claim 22, wherein the control voltage signal for said voltage-controlled device is a relatively constant bias voltage.

26. The current steering circuit of claim 22, further including an inactive compensation device coupled between said data-switched device and said summing node so as to reduce data-switching-induced capacitive effects, and associated voltage perturbations, at said summing node.

27. A reduced-capacitance current steering circuit configured to reduce data-switching-induced capacitive effects, comprising:
   a current steering circuit including a current source biased to feed a substantially constant current into a summing node, where the current is steered either to an output leg or to a ground leg;
   a data-switched bipolar transistor coupled into one of the circuit legs for controlling the current steering operation in response to a data switching signal;
   a voltage-controlled MOS transistor, coupled into the other circuit leg, for receiving a control voltage signal such that it switches cooperatively with said data-switched device;
   said data-switched bipolar transistor being made sufficiently small relative to a comparable MOS transistor that the capacitive effect at said summing node is significantly reduced relative to the capacitive effect that would result from the use of a data-switched MOS transistor.

28. The current steering circuit of claim 27, wherein the control voltage signal for said voltage-controlled transistor is a relatively constant bias voltage.

29. A reduced-capacitance current steering circuit configured to reduce data-switching-induced capacitive effects, comprising:
   a current steering circuit including a current source biased to feed a substantially constant current into a summing node, where the current is steered either to an output leg or to a ground leg;
   a data-switched MOS transistor coupled into one of the circuit legs for controlling the current steering operation in response to a data switching signal;

a voltage-controlled MOS transistor, coupled into the other circuit leg, for receiving a control voltage signal such that it switches cooperatively with said data-switched MOS transistor;

at least one of said data-switched and said voltage-controlled MOS transistors having its back-gate voltage controlled so as to reduce data-switching-induced capacitive effects, and associated voltage perturbations, at said summing node, thereby providing a design variable.

30. The current steering circuit of claim 29, further including a compensation device coupled into either said output leg or said ground leg so as to reduce data-switching-induced capacitive effects, and associated voltage perturbations, at said summing node.

31. The current steering circuit of claim 30, wherein said compensation device is an inactive compensation device coupled between said data-switched MOS transistor and the summing node to dampen voltage perturbations.

32. The current steering circuit of claim 30, wherein said compensation device is an active compensation device that is controlled to counteract capacitive effects, thereby providing a design variable.

33. A method of fabricating a reduced-capacitance current steering circuit which includes a current source biased to feed a substantially constant current into a summing node, where the current is steered either to an output leg or to a ground leg, and which includes a data-switched MOS transistor coupled into one of the circuit legs for controlling the current steering operation in response to a data switching signal, and a voltage-controlled MOS transistor, coupled into the other circuit leg, for receiving a control voltage signal such that it switches cooperatively with said data-switched device, comprising the steps:

for at least the data-switched transistor, configuring the layout for associated contact areas and the control gate for minimum spacing consistent with minimum layout requirements;

configuring the layout for moat perimeter for minimum spacing from the contact areas and the control gate consistent with minimum layout requirements;

such that moat area is minimal consistent with minimum layout requirements, thereby minimizing junction capacitance associated with such transistor, and reducing capacitive effects, and associated voltage perturbations, at said summing node.

34. The fabrication method of claim 33, further comprising the steps:

for the data-switched transistor, forming a U-shaped gate; and making a contact between the summing node and the data-switched transistor within the U-shaped gate, thereby reducing the effect of junction capacitance, and associated voltage perturbations, at said summing node.

35. The fabrication method of claim 33, wherein the voltage-controlled transistor is located in the output leg of the current steering circuit, further comprising the steps:

for the voltage-controlled transistor, forming a U-shaped gate; and making a contact between the output of the current steering circuit and the voltage-controlled transistor within the U-shaped gate, thereby reducing the effect of junction capacitance, and associated voltage perturbations, on the output.

* * * * *